METHOD OF PRODUCING SEMICONDUCTOR DEVICES

Filed May 3, 1967

INVENTORS.
ALLEN G. BAKER
and BRIAN DALE

BY David M. Keay
AGENT.

INVENTORS.
ALLEN G. BAKER
and BRIAN DALE

BY David M. Keay

AGENT.

INVENTORS.
ALLEN G. BAKER
and BRIAN DALE

BY David M Keay

AGENT.

INVENTORS.
ALLEN G. BAKER
and BRIAN DALE

BY David M. Keay

AGENT.

United States Patent Office 3,421,204
Patented Jan. 14, 1969

3,421,204

METHOD OF PRODUCING SEMICONDUCTOR DEVICES

Allen G. Baker, Cambridge, and Brian Dale, Lynnfield, Mass., assignors to Sylvania Electric Products Inc., a corporation of Delaware Filed May 3, 1967, Ser. No. 635,905
U.S. Cl. 29—577 9 Claims
Int. Cl. H01l *1/16;* H01l *7/16;* H01l *7/68*

ABSTRACT OF THE DISCLOSURE

Method of forming an array of silicon dice from a wafer by etching away some of the silicon oxide coating the wafer, leaving oxide over the regions of the wafer which are to become dice and also leaving a segment of oxide projecting from the oxide over each region. A grid of supporting members is formed with each of the segments of silicon oxide adhering to the grid. Then, silicon of the wafer is dissolved so as to leave individual dice attached to the grid only by the segments of silicon oxide. Each die can be separated from the grid by breaking of the associated oxide segment.

*Background of the invention*

This invention relates to semiconductor electrical translating devices. More particularly, it is concerned with improved methods of producing semiconductor devices including fabricating an array of semiconductor elements from which individual elements readily can be removed for mounting.

Present techniques of diffusing conductivity type imparting materials through small, precisely defined openings in protective coatings (typically silicon oxide) on bodies of semiconductor material (typically silicon) have made possible the fabrication of semiconductor devices such as diodes, transistors, and integrated circuit networks of exceptionally small size. By employing these processing techniques the electrically active zones of a large number of devices are fabricated simultaneously in a single wafer of semiconductor material.

After the formation of the electrically active zones, the wafer is divided into individual dice, each containing the electrically active zones of a semiconductor device. Typically, from this point on each die is processed as an individual unit. Each die is individually manipulated, oriented, properly positioned on a suitable mounting header, such as a part of an enclosure or a circuit board, and then bonded in place with appropriate electrical connections provided between the active zones and conductive members of the header.

A method of handling semiconductor elements and headers in batches while successively mounting the semiconductor elements onto the headers which avoids many of the problems inherent in the more traditional mounting procedures is described and claimed in application Ser. No. 539,444, filed Apr. 1, 1966, now Patent No. 3,387,359, by Brian Dale and Robert C. Ingraham entitled, "Method of Producing Semiconductor Devices," and assigned to the assignee of the present invention. In the method described in the foregoing application, semiconductor elements are supported in a network of supporting members of the so-called beam-lead construction by beams fixed to each individual semiconductor element and to the supporting network. The entire array is manipulated and oriented to position each element in succession in proper position for mounting. The beam holding a semiconductor element in the network is not cut to sever the element from the array until the element is properly aligned with respect to a mounting header and the mounting apparatus.

*Summary of the invention*

In accordance with the present invention an array of semiconductor elements is fabricated from a body of semiconductor material having a plurality of regions, each region having the electrically active zones of a semiconductor element fabricated therein. A surface of the body is coated with an adherent layer of a non-conductive protective material, such as silicon oxide. A supporting network is formed with the network adherent to a portion of the layer of non-conductive material adherent to each of the regions. The network is adherent to each of the portions at a point spaced from its associated region. Prior to formation of the supporting network portions of the layer of non-conductive material may be removed from the body of semiconductor material to expose the surface of predetermined portions of the body adjacent each of the regions, to leave non-conductive material overlying portions of the surface of each of the regions, and to leave a segment of non-conductive material projecting from the non-conductive material overlying the surface of each of the regions. After formation of the supporting network semiconductor material of the body is removed to leave discrete dice of semiconductor material, each die including the electrically active zones of a semiconductor element and being supported in the network by the non-conductive material adherent to the associated region and adherent to the network. Thus, an array of semiconductor elements is provided in which each element is positioned in the array in a predetermined manner.

Semiconductor elements of the array may then be mounted on mounting headers. A mounting header is positioned at a bonding location and oriented in a predetermined manner. The non-conductive material supporting a semiconductor element in the network is broken either before or subsequent to mounting of the semiconductor element on the header, depending upon the particular transfer and bonding procedures employed.

*Brief description of the drawings*

Various objects, features, and advantages of the method of the invention will be apparent from the following detailed discussion and the accompanying drawings wherein.

Figure 1:
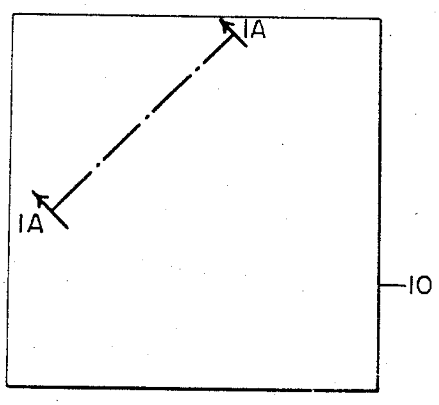
FIG. 1 is a plan view of a fragment of a wafer of silicon within which the electrically active zones of a plurality of semiconductor transistors have been formed by diffusion.

Because of the extremely small size of various portions of the items illustrated in the drawings some of the dimensions, particularly vertical dimensions, of many of the items have been exaggerated with respect to other dimensions. It is believed that greater clarity of presentation is thereby obtained despite consequent distortion of items in relation to their actual physical appearance.

*Detailed description of the invention*

Figure 1A:
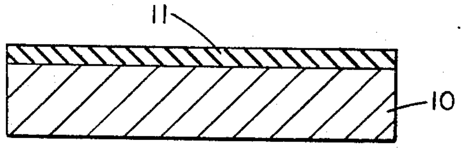
FIG. 1A is an enlarged view of a portion of the fragment of FIG. 1 taken in cross-section along line 1A—1A of FIG. 1.

A fragment of a wafer of silicon 10 having the electrically active zones of a plurality of identical semiconductor elements fabricated therein is illustrated in FIGS. 1 and 1A. The electrically active zones of the semiconductor elements were formed by diffusing conductivity type imparting materials into the wafer through openings in oxide coatings on the surface of the wafer to form zones of opposite conductivity types. For illustrative purposes each group of zones is the electrically active zones of a transistor. Each group of zones occupies a region of the wafer, and the regions are evenly distributed in a regular pattern over the wafer. The surface of the water into which the conductivity type imparting materials have been diffused is coated with an adherent protective layer of silicon oxide 11. Depending upon the procedures employed in producing the diffused zones, the oxide coating may or may not have openings therein at the stage depicted in FIGS. 1 and 1A. No openings are shown in FIGS. 1 and 1A.

The wafer 10 is treated in accordance with well-known photo-resist masking and chemical etching techniques to remove the adherent silicon oxide layer from certain predetermined portions of the wafer of silicon. The layer of oxide is coated with a photosensitive resistant masking material. Then the photosensitive masking material is exposed to ultraviolet light through a mask having regions which are transparent to and regions which are opaque to ultraviolet light. The opaque regions of the mask delineate the pattern of the portions of the oxide layer which are to be removed, and the transparent regions delineate the portions of the oxide layer which are to remain. Upon being subjected to ultraviolet light, the portions of the masking material underlying the transparent regions of the mask become polymerized. The wafer of semiconductor material is then subjected to a suitable developing solution which washes away the portions of the masking material which were protected from the ultraviolet light by the opaque regions of the mask and, therefore, not polymerized. The underlying portions of the silicon oxide layer are thereby exposed.

The wafer of semiconductor material is then subjected to an etching solution which dissolves silicon oxide but does not attack silicon or the polymerized masking material. For example, a mixture of 400 milliliters of 40 percent by weight ammonium fluoride aqueous solution and 35 milliliters of 48 percent by weight hydrogen fluoride solution may be used. The exposed portions of the silicon oxide layer are dissolved, thereby exposing the underlying surface areas of the silicon wafer. Then the masking material is removed from the silicon oxide by dissolving in a suitable solvent.

Figure 2:
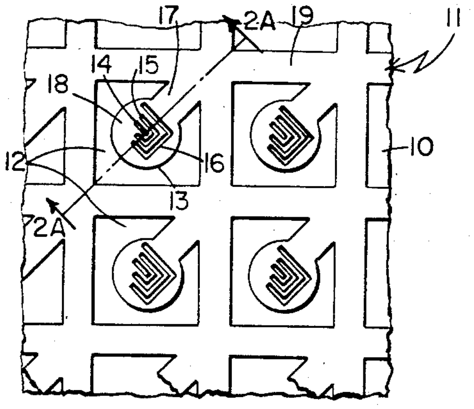
FIG. 2 is a plan view of the fragment of FIG. 1 after removal of silicon oxide from portions of the wafer.
Figure 2A:
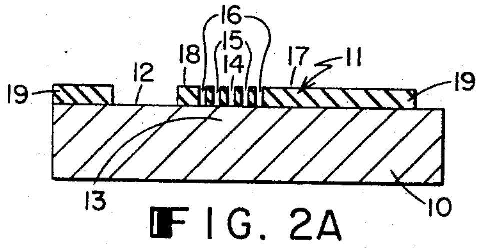
FIG. 2A is an enlarged view of a portion of the fragment taken in cross-section along line 2A—2A of FIG. 2.

As illustrated in FIGS. 2 and 2A the oxide is removed from portions 12 of the wafer lying adjacent the regions 13 containing the electrically active zones. In addition, openings are formed in the oxide layer 11 to expose surface areas of the electrically active zones so as to permit electrical contact to be made to the zones. As illustrated, the semiconductor elements are transistors, and the openings 14, 15, and 16 expose surface areas of the emitter, base, and collector zones, respectively. The silicon oxide of the layer remaining on the surface of the wafer includes a segment 17 of silicon oxide in the shape of a single bar projecting from the silicon oxide 18 overlying each region containing the active zones of a semiconductor element. The segments extend to a network of silicon oxide strips 19. As shown, the network is in the form of a grid of two sets of parallel strips intersecting at right angles. A region 13 containing the electrically active zones of a semiconductor element is located centrally of each opening formed by the intersecting sets of oxide strips. Although only a single bar of silicon oxide is shown projecting from the oxide over each region, two or more may be employed if it is found desirable. It is also possible to leave all the silicon between each region and the grid, removing oxide only to form the openings 14, 15, and 16.

Figure 3:
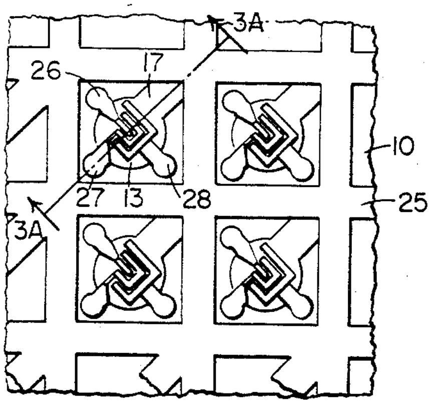
FIG. 3 is a plan view of the fragment of the wafer after beam-lead supporting members have been deposited on the wafer in the form of a supporting grid and as contact members connected to the electrically active zones of each transistor.
Figure 3A:
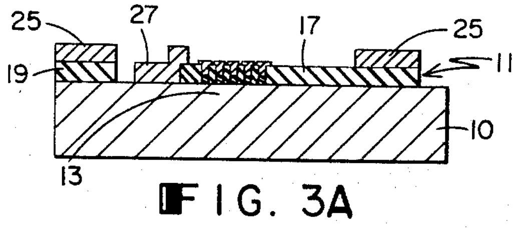
FIG. 3A is an enlarged view of a portion of the fragment taken in cross-section along line 3A—3A of FIG. 3.

Next, a network of adherent conductive supporting members or beams 25 is formed on the surface of the oxide strips 19 of the grid as illustrated in FIGS. 3 and 3A. The supporting network is produced on the wafer by the method of forming conductive supporting structures described and claimed in copending application Ser. No. 498,039, filed Oct. 19, 1965, by Allen G. Baker and Robert C. Ingraham entitled, "Method of Producing Semiconductor Devices Having Connecting Leads Attached Thereto," and assigned to the assignee of the present invention.

At the same time, conductive contact members 26, 27, and 28 are formed for each semiconductor element. The contact members overlie and are adherent to portions of the oxide layer overlying the regions 13 of the wafer. They also extend beyond the regions 13 and overlie portions 12 of the exposed silicon. Portions of the contact members make electrical connection to the emitter, base, and collector zones at the openings in the oxide coating. It is not necessary that these portions be thick enough to be supporting beams. Ohmic connections between the contact members and the silicon surface may be obtained by the known technique of forming platinum silicide contacts to the exposed silicon prior to formation of the supporting beam structure, as described in the aforementioned Baker and Ingraham application.

After the supporting beam network and the contact members have been fabricated, the silicon of the wafer is removed except for the regions 13 containing the active zones of the semiconductor elements. This procedure may be accomplished by mounting the wafer with its upper surface against a suitable block or plate. The thickness of the entire wafer is then reduced by lapping the exposed under surface of the wafer or immersing the assembly in a suitable etching solution which dissolves silicon. For example, a mixture of 1 part by volume of 48 percent by weight hydrogen fluoride solution and 20 parts by volume of C.P. grade nitric acid may be used as an etching solution. After the wafer has been reduced to the desired thickness, the under surface of the wafer is masked to protect only the regions 13 containing the active zones, and the assembly is immersed in the etching solution. Treatment is continued until all unprotected silicon is dissolved.

Figure 4:
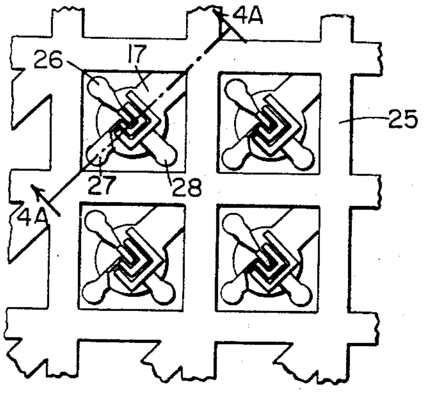
FIG. 4 is a plan view of the fragment after the removal of a major portion of the silicon of the body to leave individual dice supported in the supporting grid by segments of silicon oxide.
Figure 4A:
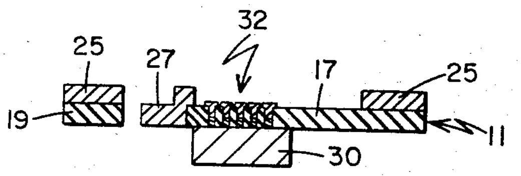
FIG. 4A is an enlarged view of a portion of the fragment taken in cross-section along line 4A—4A of FIG. 4.

The resulting array of semiconductor elements is shown in FIGS. 4 and 4A. Each semiconductor element 32 of the array includes a discrete die 30 of silicon having a group of diffused active zones constituting a transistor. Contact members 26, 27, and 28 which have supporting portions adhering to each die and projecting outward from the die make contact to the active zones thereby providing electrical connections to the emitter, base, and collector zones, respectively, of the element. In the process of dissolving the silicon of the wafer, all silicon must be removed from the projecting portions of the contact members to prevent shorting of the members to the silicon die.

A segment 17 of silicon oxide projects from the oxide overlying each silicon die and adheres to the grid structure 25. Thus, each of the semiconductor elements 32 is supported in the grid network by a segment of silicon oxide extending from the die to the grid. As shown, the supporting grid structure 25 is comprised of two sets of parallel support members intersecting at right angles in the pattern of the oxide strips. A silicon die is located centrally of each opening formed by intersecting sets of support members, producing a regular two-dimensional array of substantially identical elements in a square pattern of even rows and columns.

As a specific example, an array of semiconductor elements as shown in FIGS. 4 and 4A may include silicon dice 30 which are approximately 6 mils in diameter and 1½ mils thick and spaced at 20 mil intervals in both directions. The supporting portions of the contact members 26, 27, and 28 and the grid structure are about .4 mil thick and the grid beams are about 3 mils wide. The supporting members are of gold except for a thin layer at the surface in contact with the oxide coating. The bar of oxide 17 is approximately 10,000 angstrom units thick and 2 mils wide. A bar of silicon oxide of these dimensions is structurally strong enough to support the die within the grid.

Figure 5:
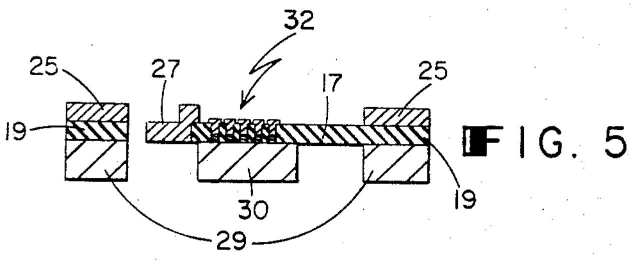
FIG. 5 is an enlarged view in cross-section of a portion of a fragment of a wafer which has been processed in accordance with a modification of the method of the invention.

In order to increase the strength of the supporting network, the under surface of the wafer may be masked with resist to protect the regions underlying the support members 25 when the silicon is being dissolved to form the individual dice. The resulting structure is illustrated by FIG. 5. Silicon members 29 coextensive with the grid structure 25 increase the strength of the supporting network.

Figures 6, 8:
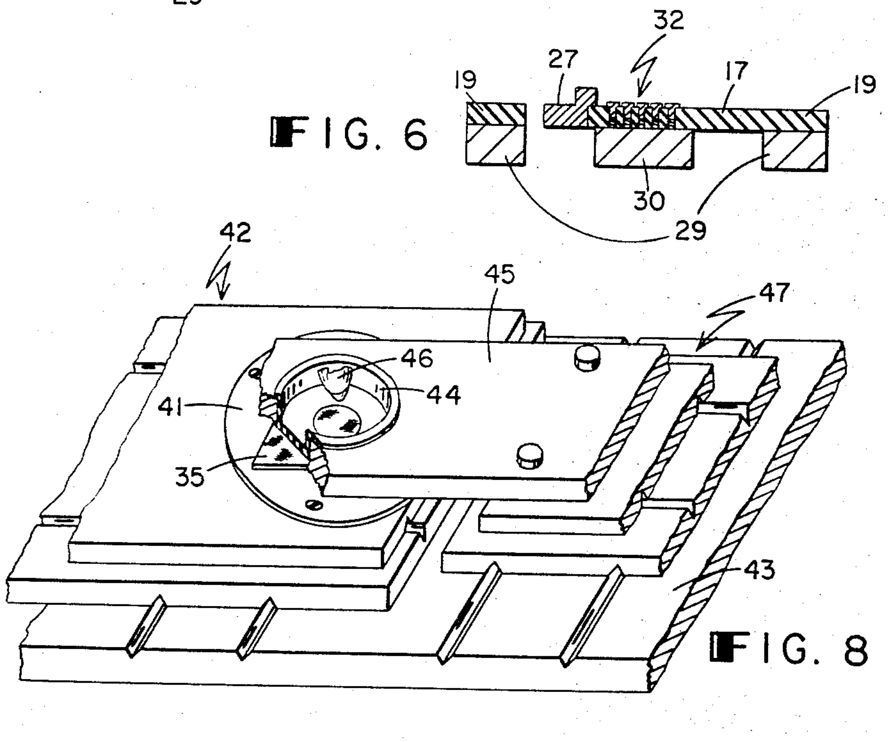
FIG. 6 is an enlarged view in cross-section of a portion of a fragment of a wafer which has been processed in accordance with another modification of the method of the invention.
FIG. 8 is a representation in perspective of movable supports and a tool column for successively aligning semiconductor elements of an array above mounting headers of an array and for bonding the aligned semiconductor element to conductive regions of the mounting header.

It is also possible to fabricate an array of semiconductor elements employing only silicon as the grid members. This modification is illustrated in FIG. 6. In producing an array of this type conductive supporting beams are not formed on the oxide strips 19. Instead, the under surface of the wafer in the regions underlying the oxide strips 19 is masked with a suitable resist prior to immersion of the wafer in the silicon etching solution. Thus, the silicon supporting members 29 are formed at the same time as the discrete dice 30.

Although in the modifications of the array as illustrated in FIGS. 4 and 4A, 5, and 6 of the contact members 26, 27, and 28 are shown as including supporting portions overhanging the die 30, other types of contact members are also possible. For example, thin aluminum contacts may be deposited onto the oxide overlying the regions of the active zones, or portions of contacts overlying the oxide can be increased in thickness to provide contacting pads. The particular type of contact members to be formed depends upon the manner in which the semiconductor elements of the array are to be mounted and connected to mounting headers.

One example of a manner in which semiconductor elements of an array may be mounted on headers is illustrated by FIGS. 7 through 10. The individual semiconductor elements 32 of an array of elements may be mounted successively on the mounting headers of an array of headers 35 shown in FIG. 7. The array includes a flat plate or board 36 of non-conductive material having a plurality of groups of conductive regions 37, 38, and 39 on one surface. The array may be produced as in the manner of fabricating circuit boards in which a clad metal layer, as of copper, on an insulating board is selectively removed to leave a desired pattern of conductive regions. The board is then suitably plated to provide a surface layer of gold on the conductive regions.

Figure 7:
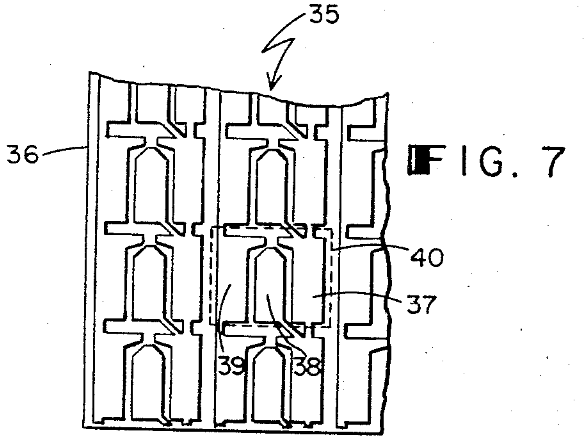
FIG. 7 is a plan view of a fragment of an array of mounting headers showing several groups of conductive regions to which semiconductor elements of an array are to be attached.

Each group of conductive regions together with the portion of the insulating board to which it adheres provides a mounting header, one of which is delinated by the dashed line 40 in FIG. 7. The configuration and spacing of the conductive regions of each group is such that they will accommodate the contact members of a semiconductor element and provide conductive paths for the active zones of the element as will be explained hereinafter. As shown, the substantially identical groups of conductive regions are located on the insulating board to provide a regular two-dimensional array of mounting headers arranged in a square pattern of even rows and columns.

Although each header of the array as shown is suitable for mounting a single semiconductor element, each mounting header may include an arrangement of conductive regions to accommodate two or more semiconductor elements and also other components. That is, the array of mounting headers could be an array of circuit boards.

A representation of portions of apparatus for removing semiconductor elements from the array of semiconductor elements and bonding them to the mounting headers of the array of headers is illustrated in FIG. 8. The array of mounting headers 35 is mounted on a rotatable plate 41, which in turn is mounted on a lateral slider assembly 42. Thus, the array of headers may be rotated, to a limited extent, and moved laterally in any direction to orient the mounting headers and register them in a desired position with respect to a base member 43.

The array of semiconductor elements, a fragment of which is shown in FIGS. 4 and 4A, is attached to the periphery of a central opening in a ring 44 with the supporting network 25 downward. The supporting ring 44 holding the array of semiconductor elements is rotatably mounted in an opening in an overhanging plate 45 so that the semiconductor elements are below the surface of the plate and are located above the array of mounting headers. The plate 45 is mounted on a lateral slider assembly 47 so as to permit limited vertical movement with respect to the assembly and the base member 43. Thus, the array of semiconductor elements may be rotated and moved laterally in any direction to orient the semiconductor elements and register them in a desired position with respect to the base member 43; and, in addition, the array may be moved vertically a limited distance with respect to the base member.

This arrangement permits any one of the semiconductor elements and any one of the mounting headers to be positioned directly beneath a vertically movable tool column 46. After the plate 41 has been rotated to orient the mounting headers properly, movement of the array through increments of a predetermined distance by means of a slider assembly 42 successively places the mounting headers in desired position beneath the tool column 46. Similarly, after the supporting ring 44 has been rotated so as to properly orient the semiconductor elements, movement of the plate 45 through increments of a predetermined distance by means of the slider assembly 47 successively places semiconductor elements in desired position beneath the tool column 46.

Figure 9:
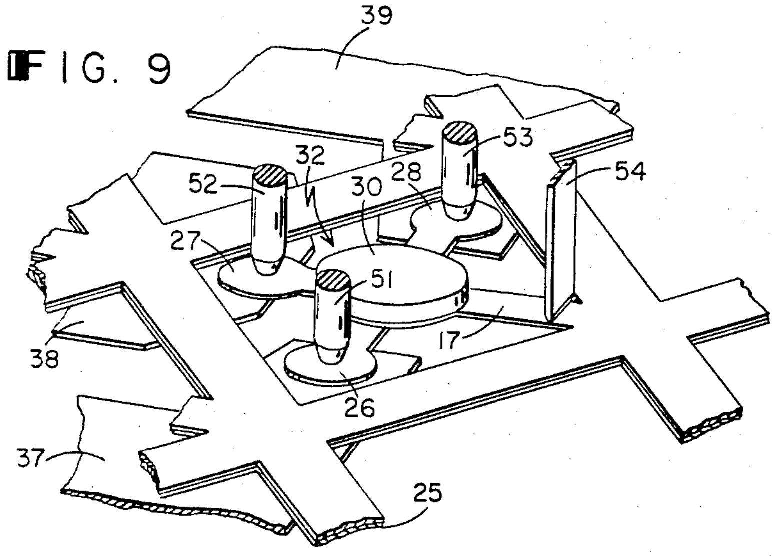
FIG. 9 is a perspective view illustrating a semiconductor element superimposed on a group of conductive regions of a mounting header and being bonded thereto.

FIG. 9 illustrates registration of the array of semiconductor elements with respect to the array of mounting headers with a group of conductive regions 37, 38, and 39 of a mounting header positioned in bonding location beneath the the tool column 46 and with a properly oriented semiconductor element 32 superimposed on the mounting header in position to be attached thereto. Each of the projecting contact members 26, 27, and 28 connected to an active zone of the semiconductor element is aligned with a mating portion of a different conductive region of the group of regions.

After the array of headers and the array of semiconductor elements have been moved horizontally to obtain proper alignment, the overhanging plate 45 is lowered to place the semiconductor element 32 in contact with the mounting header at the bonding location. Then the tool column is lowered pressing bonding tools 51, 52, and 53 into contact with the projecting portions of the contact members 26, 27, and 28, respectively, of the semiconductor element as illustrated in FIG. 9.

The bonding tools force the end portions of the contact members 26, 27, and 28 against the mating portions of the conductive regions 37, 38, and 39, respectively, and bond the members to the respective regions as by ultrasonic welding. The bonds may be made simultaneously or successively, and the contact members may be bonded to the conductive regions by bonding techniques other than ultrasonic welding.

After the bonds have been made, the bonding tools are retracted, and a tool 54 is lowered to break the segment 17 of silicon oxide at a point between the supporting grid 25 and the semiconductor die 30, thus severing the bonded semiconductor element from the array. The silicon oxide is a readily breakable material, and a blow by the tool is sufficient to fracture the segment even though the tool does not extend across the full width of the segment. If the oxide supporting the element in the network consists of two or more bars or a complete sheet, the tool 54 obviously must be modfied to provide an appropriate configuration.

After the bonding operation and breaking of the supporting oxide, the overhanging plate 45 is raised slightly. The array of semiconductor elements and the array of mounting headers are each moved a predetermined distance by indexing the slider assemblies 47 and 42 to position a group of conductive regions at the bonding location and to superimpose a semidconductor element over the conductive regions at the bonding location. The process of bonding the semiconductor element to the mounting header, breaking the segment of oxide to separate the element from the array, and moving the arrays is repeated.

Figure 10:
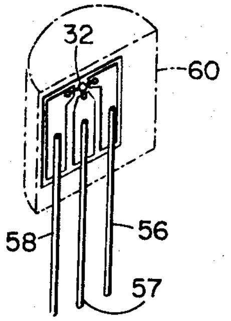
FIG. 10 is a perspective view of a completed semiconductor device showing a semiconductor element mounted on a header with the outline of the solid encapsulating material of the device enclosure indicated in phantom.

The foregoing procedure is repeated continually to produce an array of header mounted semiconductor elements. The insulating board 36 is then cut into individual headers and lead wires 56, 57, and 58 are attached to the conductive regions as by welding. Each of the headers and its mounted semiconductor element 32 is then encapsulated in a suitable plastic material. FIG. 10 illustrates a semiconductor element, individual header, and lead wires as embedded in a solid plastic enclosure 60, indicated in phantom, to provide a completed device.

Figure 11:
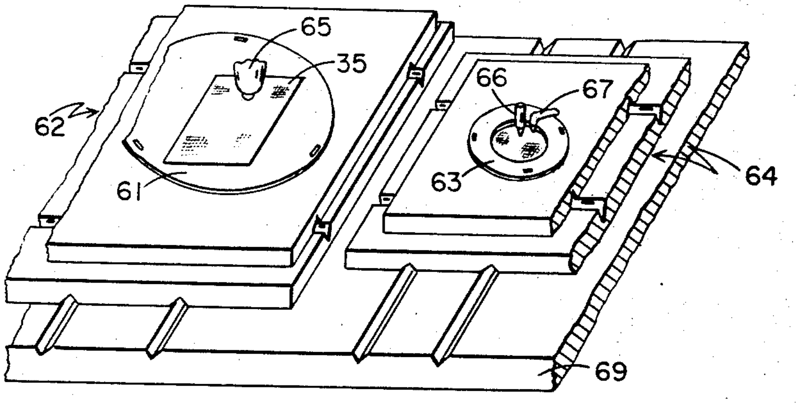
FIG. 11 is a representation in perspective of movable supports and tool supporting structures for use in transferring semiconductor elements from an array of elements and bonding them to the mounting headers of the array of headers in accordance with a different procedure.
Figure 12:
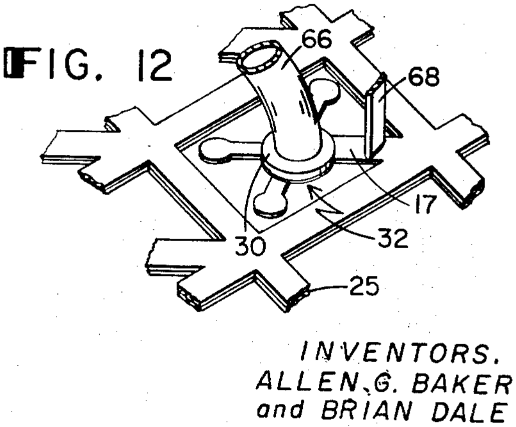
FIG. 12 is a perspective view illustrating the removal of a semiconductor element from the array of semiconductor elements.
Figure 13:
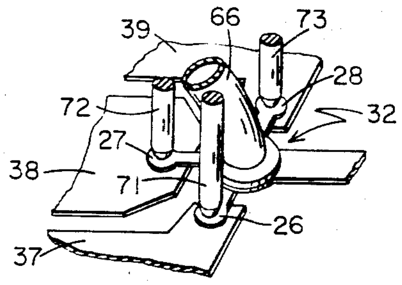
FIG. 13 is a perspective view illustrating the semiconductor element transferred from the array of elements and being bonded to a mounting header of the array of headers.

Another method of bonding semiconductor elements of an array to mounting headers of an array is illustrated by FIGS. 11, 12, and 13. The array of mounting headers 35 is mounted on a plate 61 which is rotatably mounted on a lateral slider assembly 62. The array of semiconductor elements is similarly mounted on a plate 63 which is rotatably mounted on a lateral slider assembly 64. The array of semiconductor elements may be held on the plate 63 as by bonding at the outer edge of the array.

After the array of headers has been properly positioned and oriented, the slider assembly 62 may be indexed continually through increments of a predetermined distance to place each mounting header in succession in a bonding location directly beneath a tool column 65. Similarly, after the array of semiconductor elements has been properly positioned and oriented, the slider assembly 64 may be indexed continually to place each semiconductor element in succession at a transfer location beneath a vacuum pick-up tool 66 and a tool column 67.

When a semiconductor element 32 has been placed in the transfer location, the pick-up tool 66 is lowered into contact with the semiconductor die 30 of the element as illustrated in FIG. 12. While the tip of the pick-up tool 66 grips the semiconductor die, the tool column 67 is lowered so that a breaking tool 68 fractures the segment 17 of silicon oxide, thereby severing the semiconductor element from the supporting grid 25. The pick-up tool 66 is moved to carry the severed semiconductor element 32 from the transfer location to the bonding location.

The pick-up tool 66 places the semiconductor element 32 at the bonding location with portions of the contact members 26, 27, and 28 in contact with the conductive regions 37, 38, and 39, respectively, of the mounting header at the bonding location as illustrated in FIG. 13. While the pick-up tool 66 holds the semiconductor element in proper position, the bonding tools 71, 72, and 73 are lowered and the contact members are bonded to the mating conductive regions of the header. The bonds may be made simultaneously, or one bond may be completed, the pick-up tool retracted, and then the remaining bonds made simultaneously or successively.

The procedure of moving the arrays predetermined distances, transferring a semiconductor element of the array from the transfer location to the mounting header at the bonding location, and bonding the semiconductor element to the header is repeated continually to produce an array of mounted semiconductor elements. The headers and bonded elements may then be further processed in the manner described previously to produce discrete semiconductor devices as illustrated in FIG. 10.

Another method of bonding semiconductor elements of an array to mounting headers of an array may also be illustrated by FIGS. 11, 12, and 13. The array of mounting headers and the array of semiconductor elements are mounted on plates 61 and 63, respectively, and appropriately positioned and oriented with respect to the base member 69. The pick-up tool 66 is lowered into contact with a semiconductor element as illustrated in FIG. 12, and the tool column is lowered so that the tool 68 breaks the segment 17 of silicon oxide severing the semiconductor element from the supporting network. The semiconductor element is then transferred from the array of semiconductor elements to a header of the array, and is bonded to the conductive regions of the header by the bonding tools 71, 72, and 73 as illustrated in FIG. 13.

The procedure is repeated by appropriately indexing the tool columns 65 and 67 and the pick-up tool 66 while holding the arrays fixed with respect to the base member 69. Thus, each semiconductor element in succession is severed from its fixed position, transferred to a header, and bonded to the header to produce an array of mounted semiconductor elements. The method may also be varied by breaking all of the segments 17 of silicon oxide before transferring any of the semiconductor elements from the array of semiconductor elements to the array of headers. This technique requires that shifting of the severed semiconductor elements with respect to each other be prevented until the elements are transferred from the array.

While there has been shown and described what are considered perferred embodiments of the present invention, it will be obvious to those skilled in the art that various changes and modifications may be made therein without departing from the the invention as defined in the appended claims.

What is claimed is:

1. The method of producing semiconductor devices including the steps of providing a body of semiconductor material having a plurality of regions, each region having the electrically active zones of a semiconductor element fabricated therein, and said body having a surface coated with an adherent layer of a non-conductive material;

forming a supporting network adherent to a portion of the layer of non-conductive material adherent to each of said regions, the network being adherent to each of said portions at a point spaced from the associated region; and removing semiconductor material of the body to leave discrete dice of semiconductor material, each die including the electrically active zones of a semiconductor element and being supported in said network by the portion of the layer of non-conductive material adherent to the associated region and adherent to the network, thereby providing an array of semiconductor elements.

2. The method of producing semiconductor devices including the steps of providing a body of semiconductor material having a plurality of regions, each region having the electrically active zones of a semiconductor element fabricated therein, and said body having a surface coated with an adherent layer of a non-conductive material;

removing portions of the layer of non-conductive material to expose the surface of predetermined portions of the body of semiconductor material adjacent each of the regions, to leave non-conductive material overlying portions of the surface of each of the regions, and to leave a segment of non-conductive material projecting from the non-conductive material overlying the surface of each of the regions;

forming a supporting network adherent to each of said segments of non-conductive material at a point spaced from its associated region; and removing semiconductor material of said body to leave discrete dice of semiconductor material, each die including the electrically active zones of a semiconductor element and being supported in said network by the segment of non-conductive material projecting from the non-conductive material overlying the surface of the associated region and adherent to the network, thereby providing an array of semiconductor elements.

3. The method of producing semiconductor devices including the steps of providing a body of semiconductor material having a plurality of regions, each region having the electrically active zones of a semiconductor element fabricated therein and said body having a surface coated with an adherent layer of a non-conductive material;

removing portions of the layer of non-conductive material to expose areas of each region of the body at which contact is to be made;

forming a conductive member making electrical connection to each of said regions at which contact is to be made; and removing semiconductor material of said body to form a supporting network of semiconductor material adherent to a portion of the layer of non-conductive material adherent to each of said regions, the network of semiconductor material being adherent to each of said portions at a point spaced from the associated region, and to form discrete dice of semiconductor material, each die including the electrically active zones of a semiconductor element and being supported in said network by the portion of the layer of non-conductive material adherent to the associated region and adherent to the network, thereby providing an array of semiconductor elements.

4. The method of producing semiconductor devices including the steps of providing a body of semiconductor material having a plurality of regions, each region having the electrically active zones of a semiconductor element fabricated therein, and said body having a surface coated with an adherent layer of a non-conductive material;

removing portions of the layer of non-conductive material to expose the surface of predetermined portions of the body of semiconductor material adjacent each of the regions and to leave a segment of non-conductive material projecting from the non-conductive material overlying the surface of each of the regions; and removing semiconductor material of said body to form a supporting network of semiconductor material adherent to each of said segments of non-conductive material at a point spaced from its associated region, and to form discrete dice of semiconductor material, each die including the electrically active zones of a semiconductor element and being supported in said network by the segment of non-conductive material projecting from the non-conductive material overlying the surface of the associated region and adherent to the network, thereby providing an array of semiconductor elements.

5. The method of producing semiconductor devices including the steps of providing a body of semiconductor material having a plurality of regions, each region having the electrically active zones of a semiconductor element fabricated therein, and said body having a surface coated with an adherent layer of a non-conductive material;

removing portions of the layer of non-conductive material to expose the surface of predetermined portions of the body of semiconductor material adjacent each of the regions, to leave non-conductive material overlying the surface of each of the regions except at areas at which contact is to be made, and to leave a segment of non-conductive material projecting from the non-conductive material overlying the surface of each of the regions;

forming a conductive member making electrical connection to each of said areas at which contact is to be made, each conductive member being adherent to the non-conductive material overlying the surface of the associated region and extending to over the surface of said predetermined portions of the body from which non-conductive material has been removed, and simultaneously forming a network of supporting members adherent to each of said segments of non-conductive material at a point spaced from its associated region; and removing semiconductor material of said body including said predetermined portions to leave discrete dice of semiconductor material, each die including the electrically active zones of a semiconductor element and having conductive members projecting therefrom which make electrical connection to said areas, and each die being supported in said network by the segment of non-conductive material projecting from the non-conductive material overlying the surface of the associated region and adherent to the network, thereby providing an array of semiconductor elements.

6. The method of producing semiconductor devices in accordance with claim 5 and further including the steps of providing a mounting header comprising a member of non-conductive material having a group of conductive regions theeron;

breaking the non-conductive material supporting one of the semiconductor elements in fixed relationship to every other semiconductor element thereby severing the one semiconductor element from the array of semiconductor elements;

transfering the one semiconductor element to the mounting header; and electrically connecting the conductive members of the one semiconductor element to respective conductive regions of the group.

7. The method of producing semiconductor devices including the steps of providing a body of silicon having a plurality of regions, each region having the electrically active zones of a semiconductor element fabricated therein, and said body having a surface coated with an adherent layer of silicon oxide;

removing portions of the layer of silicon oxide to expose the surface of predetermined portions of the body of silicon adjacent each of the regions, to leave silicon oxide overlying the surface of each of the regions except at areas at which contact is to be made, and to leave a segment of silicon oxide projecting from the silicon oxide overlying the surface of each of the regions;

forming a conductive member making electrical connection to each of said areas at which contact is to be made, each conductive member having a supporting portion adherent to the silicon oxide overlying the surface of the associated region and extending to over the surface of said predetermined portions of the body from which silicon oxide has been removed, and simultaneously forming a network of supporting members adherent to each of said segments of silicon oxide at a point spaced from its associated region; and removing silicon of said body including said predetermined portions to leave discrete dice of silicon, each die including the electrically active zones of a semiconductor element having supporting portions of said conductive members projecting therefrom, and each die being supported in said network by the segment of silicon oxide projecting from the silicon oxide overlying the associated region and adherent to the network, thereby providing an array of semiconductor elements.

8. The method of producing semiconductor devices in accordance with claim 7 and further including the steps of providing a mounting header comprising a member of non-conductive material having a group of conductive regions thereon, the group of regions being arranged to receive the conductive members of a semiconductor element;

breaking the segment of silicon oxide supporting one of the semiconductor elements in fixed relationship to every other semiconductor element thereby severing the one semiconductor element from the array of semiconductor elements;

transferring the one semiconductor element to the group of conductive regions to place portions of the conductive members of the one semiconductor element in contact with respective portions of conductive regions of the group; and bonding portions of the conductive members of the one semiconductor element to contacted portions of the conductive regions of the group.

9. The method of producing semiconductor devices in accordance with claim 7 and further including the steps of providing a mounting header comprising a member of non-conductive material having a group of conductive regions thereon, the group of regions being arranged to receive the conductive members of a semiconductor element;

positioning the mounting header at a bonding location with the conductive regions of the group oriented in a predetermined manner;

moving the array of semiconductor elements to position one of the semiconductor elements adjacent the group of conductive regions with portions of conductive members of the semiconductor element in registration with respective portions of conductive regions of the group;

moving the one semiconductor element toward the one group of conductive regions to place portions of conductive members of the one semiconductor element in contact with respective portions of conductive regions of the group;

bonding portions of the conductive members of the semiconductor element to contacted portions of the conductive regions of the group; and breaking the segment of silicon oxide supporting the one semiconductor element in fixed relationship to every other semiconductor element thereby severing the one semiconductor element from the array of semiconductor elements.

References Cited

UNITED STATES PATENTS

| | | | |
|---|---|---|---|
| 2,865,082 | 12/1958 | Gates | 29—583 |
| 3,158,788 | 11/1964 | Last | 317—101 |
| 3,235,428 | 2/1966 | Naymik | 29—577 X |
| 3,307,239 | 3/1967 | Lepselter et al. | 29—577 |

OTHER REFERENCES

Western Electric Tech. Dig. No. 4, October 1966, pages 15, 16.

WILLIAM I. BROOKS, *Primary Examiner.*

U.S. Cl. X.R.

29—580, 589, 569